US011451200B2

(12) United States Patent
Lee et al.

(10) Patent No.: US 11,451,200 B2
(45) Date of Patent: Sep. 20, 2022

(54) LOW POP-CLICK NOISE CLASS-D AMPLIFIER

(71) Applicant: MEDIATEK INC., Hsinchu (TW)

(72) Inventors: Fong-Wen Lee, Hsinchu (TW); Kuan-Ta Chen, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 0 days.

(21) Appl. No.: 17/132,166

(22) Filed: Dec. 23, 2020

(65) Prior Publication Data

US 2021/0265959 A1    Aug. 26, 2021

Related U.S. Application Data

(60) Provisional application No. 62/981,065, filed on Feb. 25, 2020.

(51) Int. Cl.
*H03F 3/217* (2006.01)
*H03F 1/34* (2006.01)
*H03F 1/26* (2006.01)

(52) U.S. Cl.
CPC ............. *H03F 3/2171* (2013.01); *H03F 1/26* (2013.01); *H03F 1/342* (2013.01); *H03F 2200/156* (2013.01); *H03F 2200/351* (2013.01)

(58) Field of Classification Search
CPC .......... H03F 3/2171; H03F 1/26; H03F 1/342; H03F 2200/156; H03F 2200/351; H03F 2200/03; H03F 1/305; H03F 3/2173; H03F 3/72; H03F 3/183; H03G 3/348; H04R 3/02
USPC ........................................ 330/10, 207 A, 251
See application file for complete search history.

(56) References Cited

U.S. PATENT DOCUMENTS

| 7,449,948 B2 | 11/2008 | Maejima |
| 9,955,257 B2* | 4/2018 | Zhu .................. H03F 3/2173 |
| 2008/0094135 A1 | 4/2008 | Mazda et al. |
| 2012/0183155 A1 | 7/2012 | Huang et al. |
| 2015/0288335 A1 | 10/2015 | Hoyerby |

(Continued)

FOREIGN PATENT DOCUMENTS

| JP | 2010-087811 A | 4/2010 |
| TW | I332313 B | 10/2010 |
| TW | I636660 B | 9/2018 |

OTHER PUBLICATIONS

European Search Report dated Jul. 2, 2021, issued in application No. EP 21153616.4.

(Continued)

*Primary Examiner* — Hieu P Nguyen
(74) *Attorney, Agent, or Firm* — McClure, Qualey & Rodack, LLP (57) ABSTRACT

A class-D amplifier with low pop-click noise is shown. A loop filter, a control signal generator, a first power driver, and a first feedback circuit are provided within the class-D amplifier to establish a first loop for signal amplification. The class-D amplifier further has a settling circuit and a pre-charging circuit. The settling circuit is configured to be combined with the loop filer and the control signal generator to establish a second loop to settle the loop filter and the control signal generator before the first loop is enabled. The pre-charging circuit is configured to pre-charge a positive output terminal and a negative output terminal of the first power driver.

15 Claims, 5 Drawing Sheets

(56) References Cited

U.S. PATENT DOCUMENTS

2017/0054416 A1 2/2017 Zhu et al.
2019/0356287 A1 11/2019 Lesso et al.

OTHER PUBLICATIONS

Abdelfattah, K., et al.; "A 40 nm Fully Integrated 82 mW Stereo Headphone Module for Mobile Applications;" IEEE Journal of Solid-State Circuits; vol. 49; No. 8; Aug. 2014; pp. 1702-1714.
Chinese language office action dated Jul. 6, 2021, issued in application No. TW 110102945.
Jiang, X., et al.; "Integrated Pop-Click Noise Suppression, EMI Reduction, and Short-Circuit Detection for Class-D Audio Amplifiers;" IEEE Journal of Solid-State Circuits; vol. 48; No. 4; Apr. 2013; pp. 1089-1108.

* cited by examiner

LOW POP-CLICK NOISE CLASS-D AMPLIFIER

CROSS REFERENCE TO RELATED APPLICATIONS

This application claims the benefit of U.S. Provisional Application No. 62/981,065, filed on Feb. 25, 2020, the entirety of which is incorporated by reference herein.

BACKGROUND OF THE INVENTION

Field of the Invention

The present invention relates to class-D amplifier.

Description of the Related Art

A class-D audio amplifier is basically a switching amplifier or a pulse width modulation (PWM) amplifier. In this type of amplifier, the metal-oxide-silicon transistors (MOSs) of the power driver are either fully on or fully off, significantly reducing the power losses in the output stage. A high-efficiency amplifier is achieved.

Use of class-D amplifiers is common in audio applications. However, due to the PWM control of the MOSs of the power driver, a huge current may be suddenly poured into the load (e.g., a speaker). A conventional class-D amplifier may result in a severe pop-click noise. Pop-click noise is a critical problem in audio systems, especially for earphones and EarPods. How to eliminate pop-click noise is an important issue in the field of class-D amplifiers.

BRIEF SUMMARY OF THE INVENTION

In the present invention, a solution to eliminate the pop-click noise is proposed.

A class-D amplifier in accordance with an exemplary embodiment of the present invention includes a loop filter, a control signal generator, a first power driver, and a first feedback circuit, which are configured to establish a first loop for signal amplification. The class-D amplifier further has a settling circuit and a pre-charging circuit. The settling circuit is configured to be combined with the loop filer and the control signal generator to establish a second loop to settle the loop filter and the control signal generator before the first loop is enabled. The pre-charging circuit is configured to pre-charge a positive output terminal and a negative output terminal of the first power driver which are a first positive feedback terminal and a second negative feedback terminal, respectively.

The pre-charging circuit may pre-charge the positive output terminal and the negative output terminal of the first power driver to a common voltage. The second loop may be disabled when the first loop is enabled. The settling circuit may include a second power driver and a second feedback circuit. When the second loop is enabled, the second power driver is controlled by the control signal generator to output a second feedback signal and, via the second feedback circuit, the second feedback signal is coupled to the loop filter.

In an exemplary embodiment, a common-mode terminal of the second power driver is coupled to the positive output terminal and the negative output terminal of the first power driver via the pre-charging circuit to pre-charge the positive output terminal and the negative output terminal of the first power driver to the common voltage. The second power driver may have a second positive feedback terminal and a second negative feedback terminal operative to output the second feedback signal to be transferred by the second feedback circuit. The second power driver may further have a first resistor and a second resistor coupled in series between the second positive feedback terminal and the second negative feedback terminal. A connection terminal between the first resistor and the second resistor is the common-mode terminal of the second power driver.

In an exemplary embodiment, the second power driver comprises a second positive feedback terminal and a second negative feedback terminal, operative to output the second feedback signal to be transferred by the second feedback circuit. After the positive output terminal and the negative output terminal of the first power driver are pre-charged to the common voltage, if the control signal generator operates the second power driver to set the second positive feedback terminal and the second negative feedback terminal both to the common voltage, the first loop is enabled and the second loop is disabled.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows exemplary embodiments carrying out the invention. This description is made for the purpose of illustrating the general principles of the invention and should not be taken in a limiting sense. The scope of the invention is best determined by reference to the appended claims.

Figure 1:
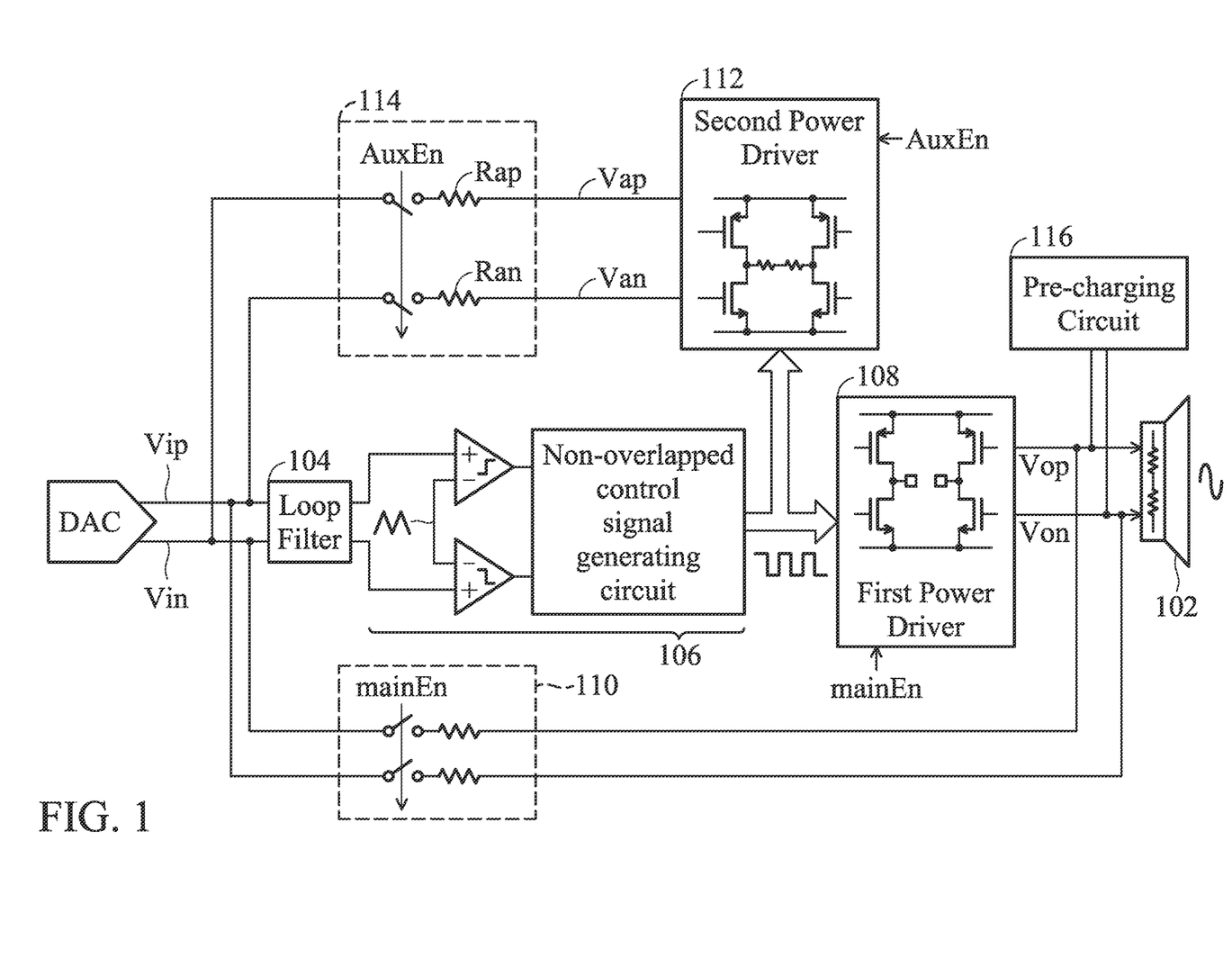
FIG. 1 depicts a class-D amplifier in accordance with an exemplary embodiment of the present invention.

FIG. 1 depicts a class-D amplifier in accordance with an exemplary embodiment of the present invention. The class-D amplifier driving a speaker 102 includes a loop filter 104, a control signal generator 106, a first power driver 108, a first feedback circuit 110, a second power driver 112, a second feedback circuit 114, and a pre-charging circuit 116.

In one embodiment of the present invention, the control signal generator 106 can be a pulse width modulation (PWM) signal generator to generate the control signals, and the control signals can be a pulse width modulation (PWM) signals. The loop filter 104, control signal generator 106, first power driver 108, and first feedback circuit 110 are configured to establish a first loop for signal amplification. An analog input signal between a positive input terminal Vip and a negative input terminal Vin of the class-D amplifier is amplified by the first loop and output from the first power driver 108 to drive the speaker 102. The speaker 102 is coupled to a positive output terminal Vop (a first positive feedback terminal) and a negative output terminal Von (a second positive feedback terminal) of the first power driver 108.

The second power driver 112 and the second feedback circuit 114 form a settling circuit. The settling circuit (including the second power driver 112 and the second feedback circuit 114) is configured to be combined with the loop filter 104 and the control signal generator 106 to establish a second loop to settle the loop filter 104 and the control signal generator 106 before the first loop for signal amplification is enabled.

The pre-charging circuit 116 is configured to pre-charge the positive output terminal Vop and the negative output terminal Von. By the pre-charging, a sudden voltage drop between the positive output terminal Vop and the negative output terminal Von is suppressed, and thereby the pop-click noise is eliminated. The speaker 102 does not output high-pitched noise when being turned on.

In an exemplary embodiment, the pre-charging circuit 116 pre-charges the positive output terminal Vop and the negative output terminal Von to a common voltage. The voltage drop between the positive output terminal Vop and the negative output terminal Von is suppressed to zero before the first loop for signal amplification is enabled. The pop-click noise is perfectly eliminated.

In an exemplary embodiment, the second loop for circuit settling is disabled (e.g., an enable signal AuxEn is deasserted) when the first loop for signal amplification is enabled (e.g., an enable signal mainEn is asserted).

When the second loop is enabled, the second power driver 112 is controlled by the control signal generator 106 to output a second feedback signal via a second positive feedback terminal Vap and a second negative feedback terminal Van, and the second feedback circuit 114 couples the second feedback signal to the loop filter 104 to establish a negative feedback for circuit settling. A resistor Rap couples the second positive feedback terminal Vap to the input port of the class-D amplifier to be combined with the negative input signal Vin and then fed to the negative input terminal of the loop filter 104. A resistor Ran couples the second negative feedback terminal Van to the input port of the class-D amplifier to be combined with the positive input signal Vip and then fed to the positive input terminal of the loop filter 104.

There are various designs for the pre-charging circuit 116.

In an exemplary embodiment, a common-mode terminal 'cm' of the second power driver 112 is coupled to the positive output terminal Vop and the negative output terminal Von via the pre-charging circuit 116, to pre-charge the positive output terminal Vop and the negative output terminal Von to the common voltage.

Figure 2:
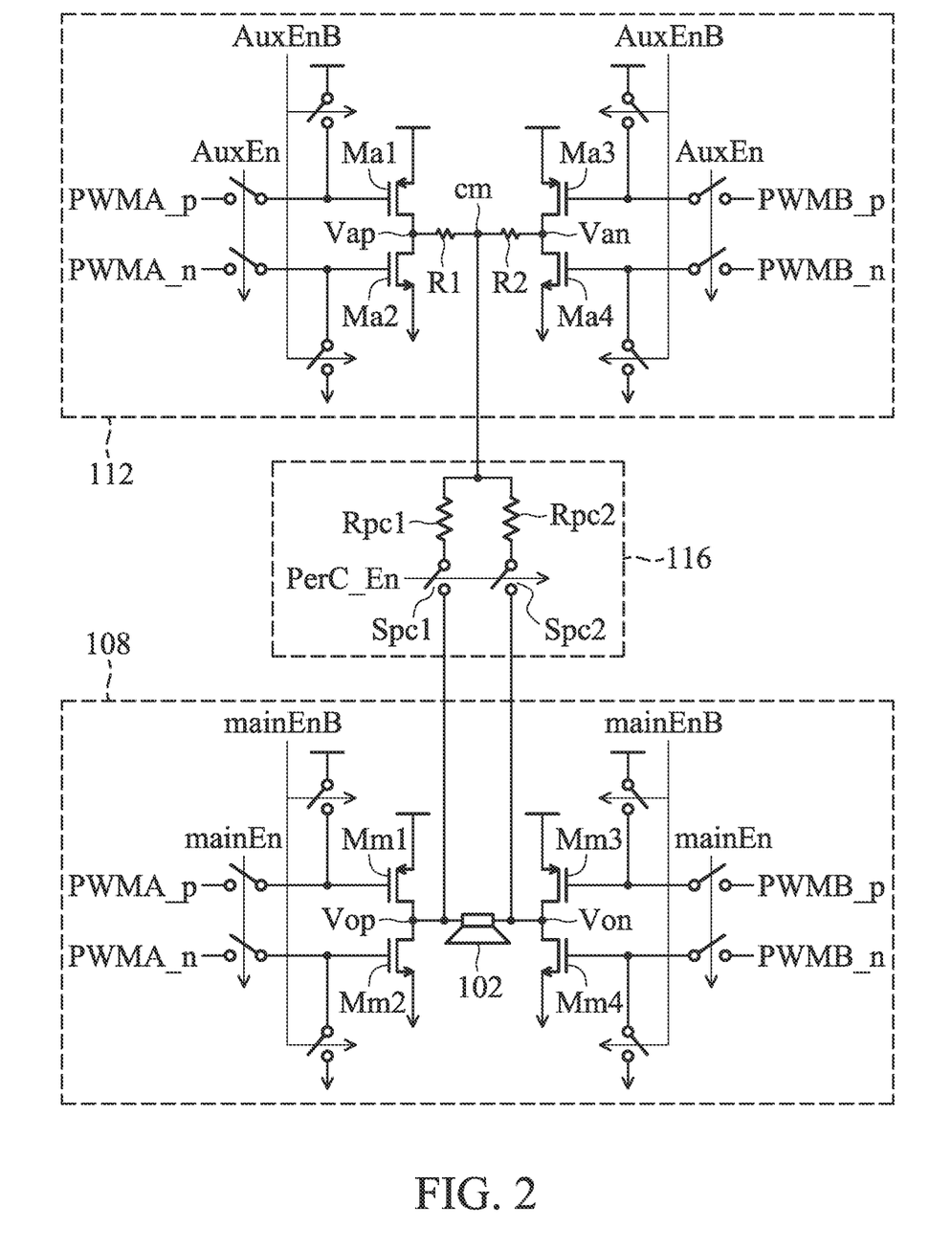
FIG. 2 illustrates circuits of the first power driver 108, the second power driver 112, and the pre-charging circuit 116 in accordance with an exemplary embodiment of the present invention.

FIG. 2 illustrates circuits of the first power driver 108, the second power driver 112, and the pre-charging circuit 116 in accordance with an exemplary embodiment of the present invention. The second power driver 112 has resistors R1 and R2 coupled in series between the second positive feedback terminal Vap and the second negative feedback terminal Van. A connection terminal between the resistors R1 and R2 is the common-mode terminal 'cm' of the second power driver 112. The resistance of the resistor R1 may equal the resistance of the resistor R2. The pre-charging circuit 116 has resistors Rpc1 and Rpc2 and switches Spc1 and Spc2. When the pre-charging circuit 116 is enabled (e.g., an enable signal PreC_En is asserted), the switches Spc1 and Spc2 are closed to couple the common-mode voltage at the common-mode terminal 'cm' of the second power driver 112 to both of the positive output terminal Vop and the negative output terminal Von. The positive output terminal Vop and the negative output terminal Von, therefore, are pre-charged to the common voltage and thereby the pop-click noise of the speaker 102 is eliminated.

As shown, the architecture of the second power driver 112 may be similar to the architecture of the first power driver 108.

The first power driver 108 comprises four metal-oxide-silicon transistors (MOSs) Mm1, Mm2, Mm3 and Mm4. When the first loop is enabled, the enable signal mainEn is asserted and the disable signal mainEnB is deasserted. Control signals PWMA_p, PWMA_n, PWMB_p, and PWMB_n generated by the control signal generator 106 are coupled to the gates of the MOSs Mm1, Mm2, Mm3 and Mm4, respectively. The MOS Mm1 is configured to couple the positive output terminal Vop to a power supply terminal according to the control signal PWMA_p. The MOS Mm2 is configured to couple the positive output terminal Vop to a ground terminal according to the control signal PWMA_n. The MOS Mm3 is configured to couple the negative output terminal Von to the power supply terminal according to the control signal PWMB_p. The MOS Mm4 is configured to couple the negative output terminal Von to the ground terminal according to the control signal PWMB_n. The control signal PWMA_p may equal the control signal PWMA_n. The control signal PWMB_p may equal the control signal PWMB_n.

The second power driver 112 comprises four MOSs Ma1, Ma2, Ma3 and Ma4. When the second loop is enabled, the enable signal AuxEn is asserted and the disable signal AuxEnB is deasserted. The control signals PWMA_p, PWMA_n, PWMB_p, and PWMB_n are coupled to the gates of the MOSs Ma1, Ma2, Ma3 and Ma4, respectively. The MOS Ma1 is configured to couple the second positive feedback terminal Vap to the power supply terminal according to the control signal PWMA_p. The MOS Ma2 is configured to couple the second positive feedback terminal Vap to the ground terminal according to the control signal PWMA_n. The MOS Ma3 is configured to couple the second negative feedback terminal Van to the power supply terminal according to the control signal PWMB_p. The MOS Ma4 is configured to couple the second negative feedback terminal Van to the ground terminal according to the control signal PWMB_n.

Figure 3:
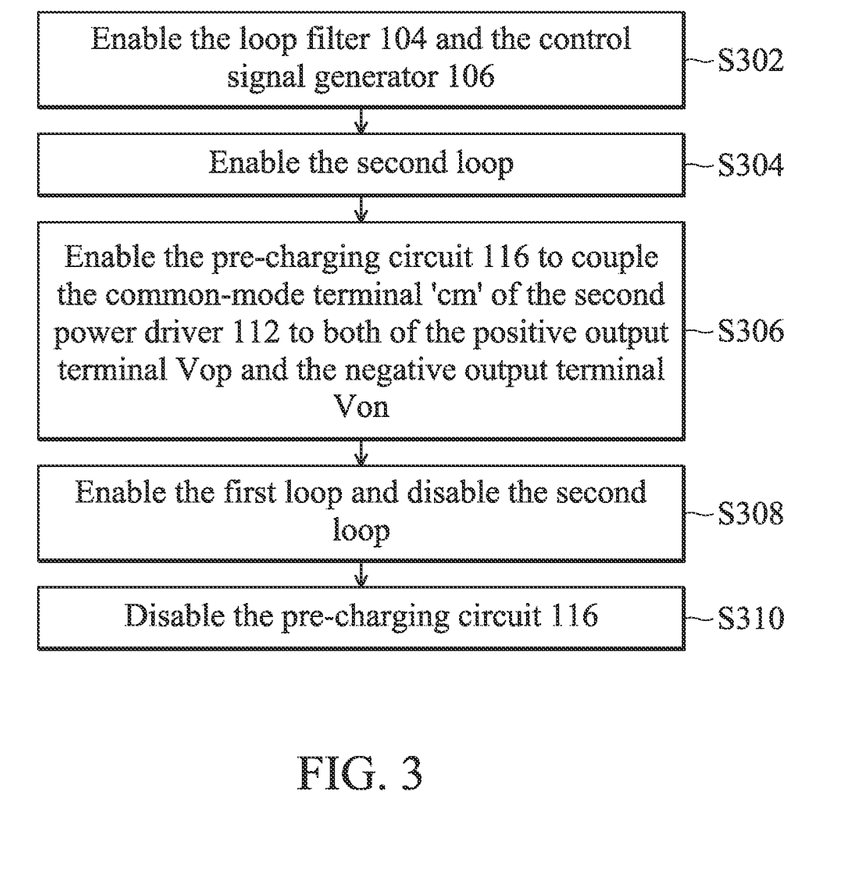
FIG. 3 is a flowchart depicting an enable/disable scheme of the different circuit blocks.

FIG. 3 is a flowchart depicting an enable/disable scheme of the different circuit blocks. In step S302, the loop filter 104 and the control signal generator 106 are enabled. In step S304, the second loop is enabled (e.g., the enable signal AuxEn is asserted and the disable signal AuxEnB is deasserted). In step S306, the pre-charging circuit 116 is enabled (e.g., the enable signal PreC_En is asserted) to couple the common-mode terminal cm of the second power driver 112 to both of the positive output terminal Vop and the negative output terminal Von. In step S308, the first loop is enabled (e.g., the enable signal mainEn is asserted and the disable signal mainEnB is deasserted) and the second loop is disabled (e.g., the enable signal AuxEn is deasserted and the disable signal AuxEnB is asserted). In step S310, the pre-charging circuit 116 is disabled (e.g., the enable signal PreC_En is deasserted).

In another exemplary embodiment, the timing to enable the first loop depends on the status of the control signals generated by the control signal generator 106. After the positive output terminal Vop and the negative output terminal Von are pre-charged to the common voltage, if the control signal generator 106 operates the second power driver 112 to set the second positive feedback terminal Vap and the second negative feedback terminal Van both to the common voltage, the first loop is enabled (e.g., the enable signal mainEn is asserted and the disable signal mainEnB is deasserted) and the second loop is disabled (e.g., the enable signal AuxEn is deasserted and the disable signal AuxEnB is asserted).

Figure 4:
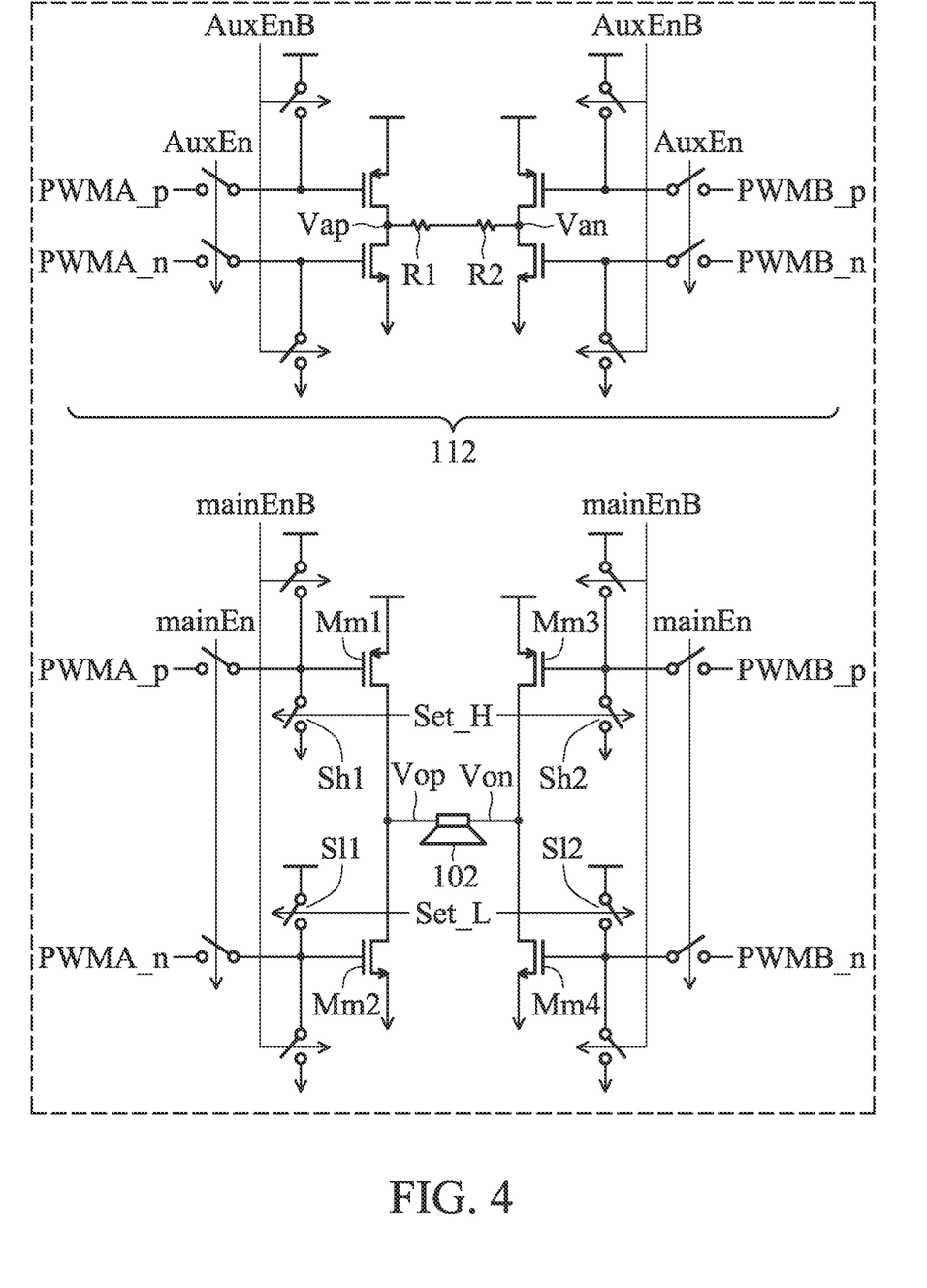
FIG. 4 illustrates circuits of the first power driver 108, the second power driver 112, and the pre-charging circuit 116 in accordance with an exemplary embodiment of the present invention.

FIG. 4 illustrates circuits of the first power driver 108, the second power driver 112, and the pre-charging circuit 116 in accordance with an exemplary embodiment of the present invention. As shown, in this exemplary embodiment, the common voltage is not provided by the second power driver 112. Instead, a high-level voltage (at the power supply terminal) or a low-level voltage (at the ground terminal) is coupled to both of the positive output terminal Vop and the negative output terminal Von by operating the pre-charging circuit 116. The resistors R1 and R2 of the second power driver 112 may be replaced by any impedance device.

The pre-charging circuit 116 includes switches Sh1 and Sh2. The switch Sh1 is coupled between a gate of the MOS Mm1 and the ground terminal. The switch Sh2 is coupled between a gate of the MOS Mm3 and the ground terminal. The switches Sh1 and Sh2 both are controlled by a pre-charging control signal Set_H. In the pre-charging phase, the pre-charging control signal Set_H is asserted, and the gates of the MOSs Mm1 and Mm3 are coupled to the ground terminal. Thus, the p-type MOSs Mm1 and Mm3 are turned on and the positive output terminal Vop and the negative output terminal Von are coupled to the power supply terminal. In this case, the positive output terminal Vop and the negative output terminal Von are pre-charged to a high-voltage level. After the pre-charging, the timing to enable the first loop depends on the status of the control signals PWMA_p, PWMA_n, PWMB_p, and PWMB_n. The first loop is enabled (e.g., the enable signal mainEn is asserted and the disable signal mainEnB is deasserted) when the control signals PWMA_p, PWMA_n, PWMB_p, and PWMB_n all are low. When the control signals PWMA_p, PWMA_n, PWMB_p, and PWMB_n all are low, the second positive feedback terminal Vap and the second negative feedback terminal Van both are coupled to the power supply terminal (i.e., set to the common voltage). The common voltage is fed to the class-D amplifier as the initial input. Because the first loop is enabled in such a situation, the positive output terminal Vop and the negative output terminal Von are kept at the high-voltage level (due to the turned-on MOSs Mm1 and Mm3). There is no voltage drop between the pre-charging state and the initial state. Pop-click noise is perfectly eliminated from the speaker 102.

FIG. 4 further shows another design for pre-charging. The pre-charging circuit 116 includes switches Sl1 and Sl2. The switch Sl1 is coupled between a gate of the MOS Mm2 and the power supply terminal. The switch Sl2 is coupled between a gate of the MOS Mm4 and the power supply terminal. The switches Sl1 and Sl2 both are controlled by a pre-charging control signal Set_L. In the pre-charging phase, the pre-charging control signal Set_L is asserted, and the gates of the MOSs Mm2 and Mm4 are coupled to the power supply terminal. Thus, the n-type MOSs Mm2 and Mm4 are turned on and the positive output terminal Vop and the negative output terminal Von are coupled to the ground terminal. In this case, the positive output terminal Vop and the negative output terminal Von are pre-charged to a low-voltage level. After the pre-charging, the timing to enable the first loop depends on the status of the control signals PWMA_p, PWMA_n, PWMB_p, and PWMB_n. The first loop is enabled (e.g., the enable signal mainEn is asserted and the disable signal mainEnB is deasserted) when the control signals PWMA_p, PWMA_n, PWMB_p, and PWMB_n all are high. When the control signals PWMA_p, PWMA_n, PWMB_p, and PWMB_n all are high, the second positive feedback terminal Vap and the second negative feedback terminal Van both are coupled to the ground terminal (i.e., set to the common voltage). The common voltage is fed to the class-D amplifier as the initial input. Because the first loop is enabled in such a situation, the positive output terminal Vop and the negative output terminal Von are kept at the low-voltage level (due to the turned-on MOSs Mm2 and Mm4). There is no voltage drop between the pre-charging state and the initial state. Pop-click noise is perfectly eliminated from the speaker 102.

Figure 5:
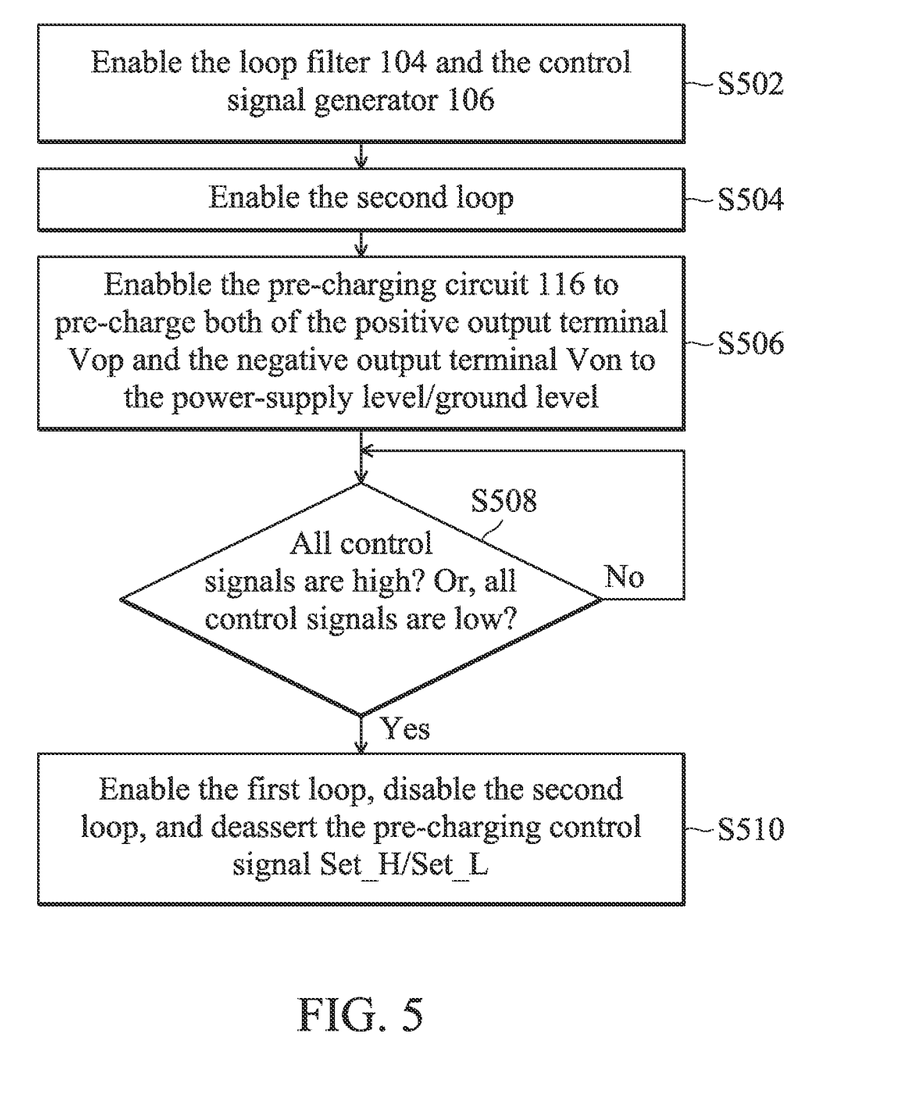
FIG. 5 is a flowchart depicting an enable/disable scheme of the different circuit blocks.

FIG. 5 is a flowchart depicting an enable/disable scheme of the different circuit blocks. In step S502, the loop filter 104 and the control signal generator 106 are enabled. In step S504, the second loop is enabled (e.g., the enable signal AuxEn is asserted and the disable signal AuxEnB is deasserted). In step S506, the pre-charging circuit 116 is enabled (e.g., pre-charging control signal Set_H/Set_L is asserted) to pre-charge both of the positive output terminal Vop and the negative output terminal Von to the power-supply level/ground level. In step S508, the status of the control signals PWMA_p, PWMA_n, PWMB_p, and PWMB_n are checked to determine the timing to enable the first loop. In the case wherein the positive output terminal Vop and the negative output terminal Von are pre-charged to the power-supply level, step S508 checks whether all control signals PWMA_p, PWMA_n, PWMB_p, and PWMB_n are low. If yes, step S510 is performed to enable the first loop (e.g., the enable signal mainEn is asserted and the disable signal mainEnB is deasserted), disable the second loop (e.g., the enable signal AuxEn is deasserted and the disable signal AuxEnB is asserted), and deassert the pre-charging control signal Set_H. In the case wherein the positive output terminal Vop and the negative output terminal Von are pre-charged to the ground level, step S508 checks whether all control signals PWMA_p, PWMA_n, PWMB_p, and PWMB_n are high. If yes, step S510 is performed to enable the first loop (e.g., the enable signal mainEn is asserted and the disable signal mainEnB is deasserted), disable the second loop (e.g., the enable signal AuxEn is deasserted and the disable signal AuxEnB is asserted), and deassert the pre-charging control signal Set_L.

Slight modification of the circuits of the first/second power driver 108/112 and the pre-charging circuit 116 is allowed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A class-D amplifier, comprising:
a loop filter, a control signal generator, a first power driver, and a first feedback circuit, configured to establish a first loop for signal amplification;
a settling circuit, configured to be combined with the loop filer and the control signal generator to establish a second loop to settle the loop filter and the control signal generator before the first loop is enabled;

a pre-charging circuit, configured to pre-charge a positive output terminal and a negative output terminal of the first power driver which are a first positive feedback terminal and a second negative feedback terminal, respectively;

wherein:

the pre-charging circuit pre-charges the positive output terminal and the negative output terminal of the first power driver to a common voltage;

the second loop is disabled when the first loop is enabled;

the settling circuit includes a second power driver and a second feedback circuit;

the second power driver is controlled by the control signal generator when the second loop is enabled, to output a second feedback signal; and the second feedback circuit couples the second feedback signal to the loop filter when the second loop is enabled.

2. The class-D amplifier as claimed in claim 1, wherein:

via the pre-charging circuit, a common-mode terminal of the second power driver is coupled to the positive output terminal and the negative output terminal of the first power driver to pre-charge the positive output terminal and the negative output terminal of the first power driver to the common voltage.

3. The class-D amplifier as claimed in claim 2, wherein the second power driver comprises:

a second positive feedback terminal and a second negative feedback terminal, operative to output the second feedback signal to be transferred by the second feedback circuit; and a first resistor and a second resistor, coupled in series between the second positive feedback terminal and the second negative feedback terminal, wherein a connection terminal between the first resistor and the second resistor is the common-mode terminal of the second power driver.

4. The class-D amplifier as claimed in claim 3, wherein:

the first power driver comprises a first metal-oxide-silicon transistor, a second metal-oxide-silicon transistor, a third metal-oxide-silicon transistor, and a fourth metal-oxide-silicon transistor;

when the first loop is enabled, the first metal-oxide-silicon transistor is controlled according to a first control signal generated by the control signal generator to couple the positive output terminal of the first power driver to a power supply terminal;

when the first loop is enabled, the second metal-oxide-silicon transistor is controlled according to a second control signal generated by the control signal generator to couple the positive output terminal of the first power driver to a ground terminal;

when the first loop is enabled, the third metal-oxide-silicon transistor is controlled according to a third control signal generated by the control signal generator to couple the negative output terminal of the first power driver to the power supply terminal; and when the first loop is enabled, the fourth metal-oxide-silicon transistor is controlled according to a fourth control signal generated by the control signal generator to couple the negative output terminal of the first power driver to the ground terminal.

5. The class-D amplifier as claimed in claim 4, wherein:

the second power driver comprises a fifth metal-oxide-silicon transistor, a sixth metal-oxide-silicon transistor, a seventh metal-oxide-silicon transistor, and an eighth metal-oxide-silicon transistor;

when the second loop is enabled, the fifth metal-oxide-silicon transistor is controlled by the first control signal to couple the second positive feedback terminal to the power supply terminal;

when the second loop is enabled, the sixth metal-oxide-silicon transistor is controlled by the second control signal to couple the second positive feedback terminal to the ground terminal;

when the second loop is enabled, the seventh metal-oxide-silicon transistor is controlled by the third control signal to couple the second negative feedback terminal to the power supply terminal; and when the second loop is enabled, the eighth metal-oxide-silicon transistor is controlled by the fourth control signal to couple the second negative feedback terminal to the ground terminal.

6. The class-D amplifier as claimed in claim 5, wherein:

the second feedback circuit comprises a third resistor and a fourth resistor;

when the second loop is enabled, the third resistor couples the second positive feedback terminal to a negative input terminal of the loop filter, and the fourth resistor couples the second negative feedback terminal to a positive input terminal of the loop filter; and a positive input terminal of the class-D amplifier is coupled to the positive input terminal of the loop filter, and a negative input terminal of the class-D amplifier is coupled to the negative input terminal of the loop filter.

7. The class-D amplifier as claimed in claim 1, wherein:

the second power driver comprises a second positive feedback terminal and a second negative feedback terminal, operative to output the second feedback signal to be transferred by the second feedback circuit; and after the positive output terminal and the negative output terminal of the first power driver are pre-charged to the common voltage, if the control signal generator operates the second power driver to set the second positive feedback terminal and the second negative feedback terminal both to the common voltage, the first loop is enabled and the second loop is disabled.

8. The class-D amplifier as claimed in claim 1, wherein:

the first power driver comprises a first metal-oxide-silicon transistor, a second metal-oxide-silicon transistor, a third metal-oxide-silicon transistor, and a fourth metal-oxide-silicon transistor;

when the first loop is enabled, the first metal-oxide-silicon transistor is controlled according to a first control signal generated by the control signal generator to couple the positive output terminal of the first power driver to a power supply terminal;

when the first loop is enabled, the second metal-oxide-silicon transistor is controlled according to a second control signal generated by the control signal generator to couple the positive output terminal of the first power driver to a ground terminal;

when the first loop is enabled, the third metal-oxide-silicon transistor is controlled according to a third control signal generated by the control signal generator to couple the negative output terminal of the first power driver to the power supply terminal; and when the first loop is enabled, the fourth metal-oxide-silicon transistor is controlled according to a fourth control signal generated by the control signal generator to couple the negative output terminal of the first power driver to the ground terminal.

9. The class-D amplifier as claimed in claim 8, wherein the second power driver comprises:
- a second positive feedback terminal and a second negative feedback terminal, operative to output the second feedback signal to be transferred by the second feedback circuit;
- an impedance device, coupled between the second positive feedback terminal and the second negative feedback terminal; and
- a fifth metal-oxide-silicon transistor, a sixth metal-oxide-silicon transistor, a seventh metal-oxide-silicon transistor, and an eighth metal-oxide-silicon transistor, wherein:
- when the second loop is enabled, the fifth metal-oxide-silicon transistor is controlled by the first control signal to couple the second positive feedback terminal to the power supply terminal;
- when the second loop is enabled, the sixth metal-oxide-silicon transistor is controlled by the second control signal to couple the second positive feedback terminal to the ground terminal;
- when the second loop is enabled, the seventh metal-oxide-silicon transistor is controlled by the third control signal to couple the second negative feedback terminal to the power supply terminal; and
- when the second loop is enabled, the eighth metal-oxide-silicon transistor is controlled by the fourth control signal to couple the second negative feedback terminal to the ground terminal.

10. The class-D amplifier as claimed in claim 9, wherein:
by operating the pre-charging circuit, the positive output terminal and the negative output terminal of the first power driver are coupled to the power supply terminal for pre-charging; and
after the pre-charging, the first loop is enabled if the first, second, third and fourth control signals all are low.

11. The class-D amplifier as claimed in claim 10, wherein the pre-charging circuit comprises:
- a first switch, coupled between a gate of the first metal-oxide-silicon transistor and the ground terminal; and
- a second switch, coupled between a gate of the third metal-oxide-silicon transistor and the ground terminal,
wherein the first switch and the second switch are turned on when the positive output terminal and the negative output terminal of the first power driver are pre-charged.

12. The class-D amplifier as claimed in claim 10, wherein:
the second feedback circuit comprises a third resistor and a fourth resistor;
when the second loop is enabled, the third resistor couples the second positive feedback terminal to a negative input terminal of the loop filter, and the fourth resistor couples the second negative feedback terminal to a positive input terminal of the loop filter; and
a positive input terminal of the class-D amplifier is coupled to the positive input terminal of the loop filter, and a negative input terminal of the class-D amplifier is coupled to the negative input terminal of the loop filter.

13. The class-D amplifier as claimed in claim 9, wherein:
by operating the pre-charging circuit, the positive output terminal and the negative output terminal of the first power driver are coupled to the ground terminal for pre-charging; and
after the pre-charging, the first loop is enabled when the first, second, third and fourth control signals all are high.

14. The class-D amplifier as claimed in claim 13, wherein the pre-charging circuit comprises:
- a first switch, coupled between a gate of the second metal-oxide-silicon transistor and the power supply terminal; and
- a second switch, coupled between a gate of the fourth metal-oxide-silicon transistor and the power supply terminal,
wherein the first switch and the second switch are turned on when the positive output terminal and the negative output terminal of the first power driver are pre-charged.

15. The class-D amplifier as claimed in claim 13, wherein:
the second feedback circuit comprises a third resistor and a fourth resistor;
when the second loop is enabled, the third resistor couples the second positive feedback terminal to a negative input terminal of the loop filter, and the fourth resistor couples the second negative feedback terminal to a positive input terminal of the loop filter; and
a positive input terminal of the class-D amplifier is coupled to the positive input terminal of the loop filter, and a negative input terminal of the class-D amplifier is coupled to the negative input terminal of the loop filter.

* * * * *